(12) United States Patent
Park et al.

(10) Patent No.: US 10,884,486 B2
(45) Date of Patent: Jan. 5, 2021

(54) PULSE WIDTH COMPENSATION CIRCUIT AND A SEMICONDUCTOR APPARATUS USING THE PULSE WIDTH COMPENSATION CIRCUIT

(71) Applicant: SK hynix Inc., Icheon-si (KR)

(72) Inventors: Min Soo Park, Anyang-si (KR); Sung Soo Chi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 151 days.

(21) Appl. No.: 16/196,995

(22) Filed: Nov. 20, 2018

(65) Prior Publication Data

US 2019/0324524 A1   Oct. 24, 2019

(30) Foreign Application Priority Data

Apr. 19, 2018 (KR) .......... 10-2018-0045634

(51) Int. Cl.
*G06F 1/3296* (2019.01)
*H03K 7/08* (2006.01)
*H03K 5/04* (2006.01)

(52) U.S. Cl.
CPC .......... *G06F 1/3296* (2013.01); *H03K 5/04* (2013.01); *H03K 7/08* (2013.01)

(58) Field of Classification Search
CPC ......... G06F 1/3296; H03K 7/08; H03K 65/04
See application file for complete search history.

(56) References Cited

U.S. PATENT DOCUMENTS

| | | | |
|---|---|---|---|
| 5,903,501 A | 5/1999 | Kurosaki | |
| 5,914,622 A * | 6/1999 | Inoue | H03K 7/08 327/172 |
| 7,196,726 B2 | 3/2007 | Kokubun et al. | |
| 9,397,642 B2 | 7/2016 | Choi et al. | |
| 2008/0024103 A1 * | 1/2008 | Komiya | H02M 3/1584 323/282 |
| 2009/0168566 A1 * | 7/2009 | Chung | G11C 7/1066 365/193 |
| 2011/0080201 A1 * | 4/2011 | Yang | H03K 7/08 327/172 |
| 2012/0182840 A1 * | 7/2012 | Kamiyama | G04C 3/143 368/205 |
| 2013/0106524 A1 | 5/2013 | Elkin et al. | |
| 2016/0036330 A1 * | 2/2016 | Sturcken | H02M 3/158 323/271 |

* cited by examiner

*Primary Examiner* — Nimesh G Patel
(74) *Attorney, Agent, or Firm* — William Park & Associates Ltd.

(57) ABSTRACT

A pulse width compensation circuit may include a voltage control circuit and a pulse width adjustment circuit. The voltage control circuit may sense a voltage level of a first power supply voltage and generate a voltage control signal. The pulse width adjustment circuit may generate an output signal by changing a pulse width of an input signal based on the voltage control signal.

15 Claims, 8 Drawing Sheets

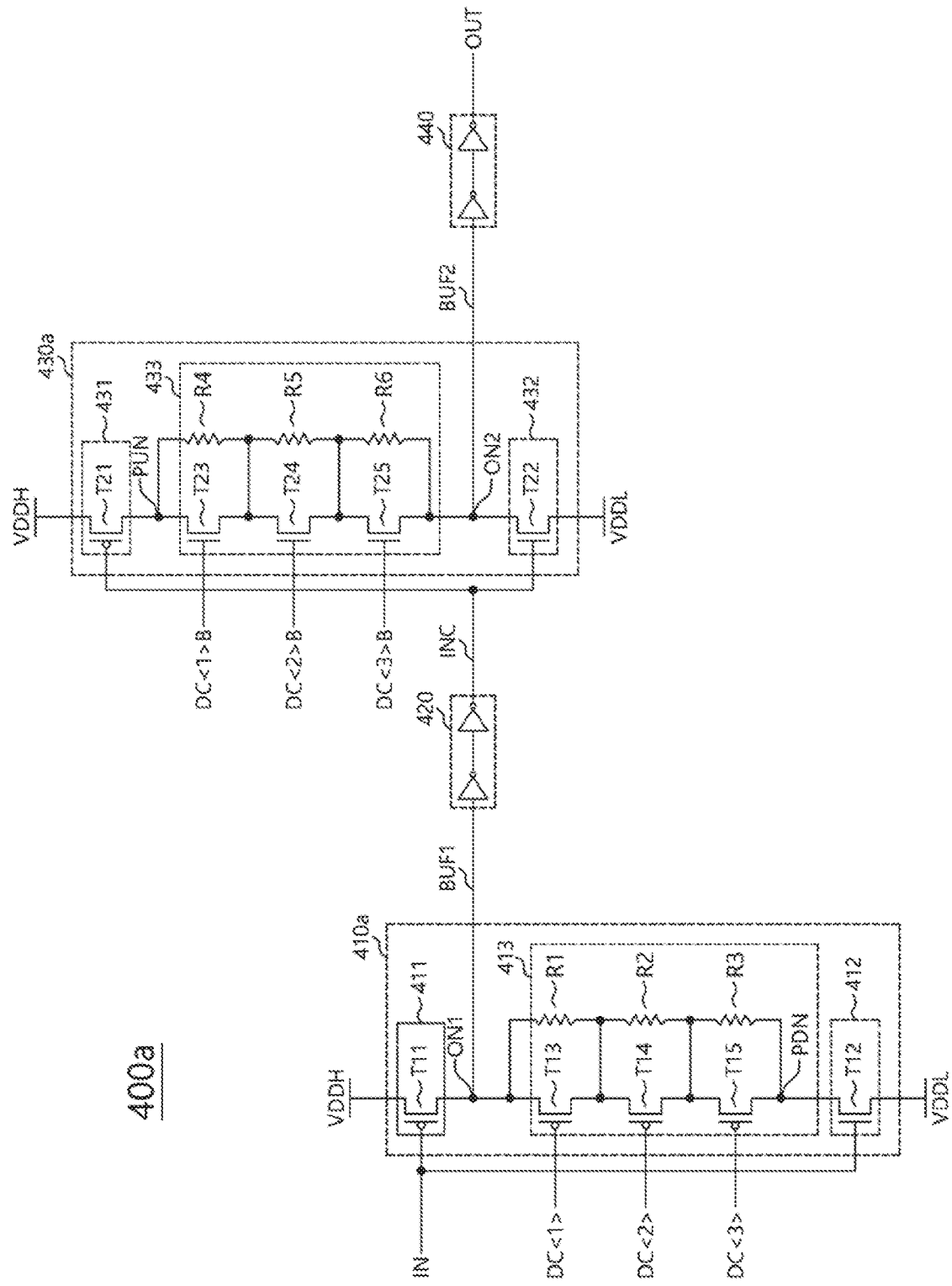

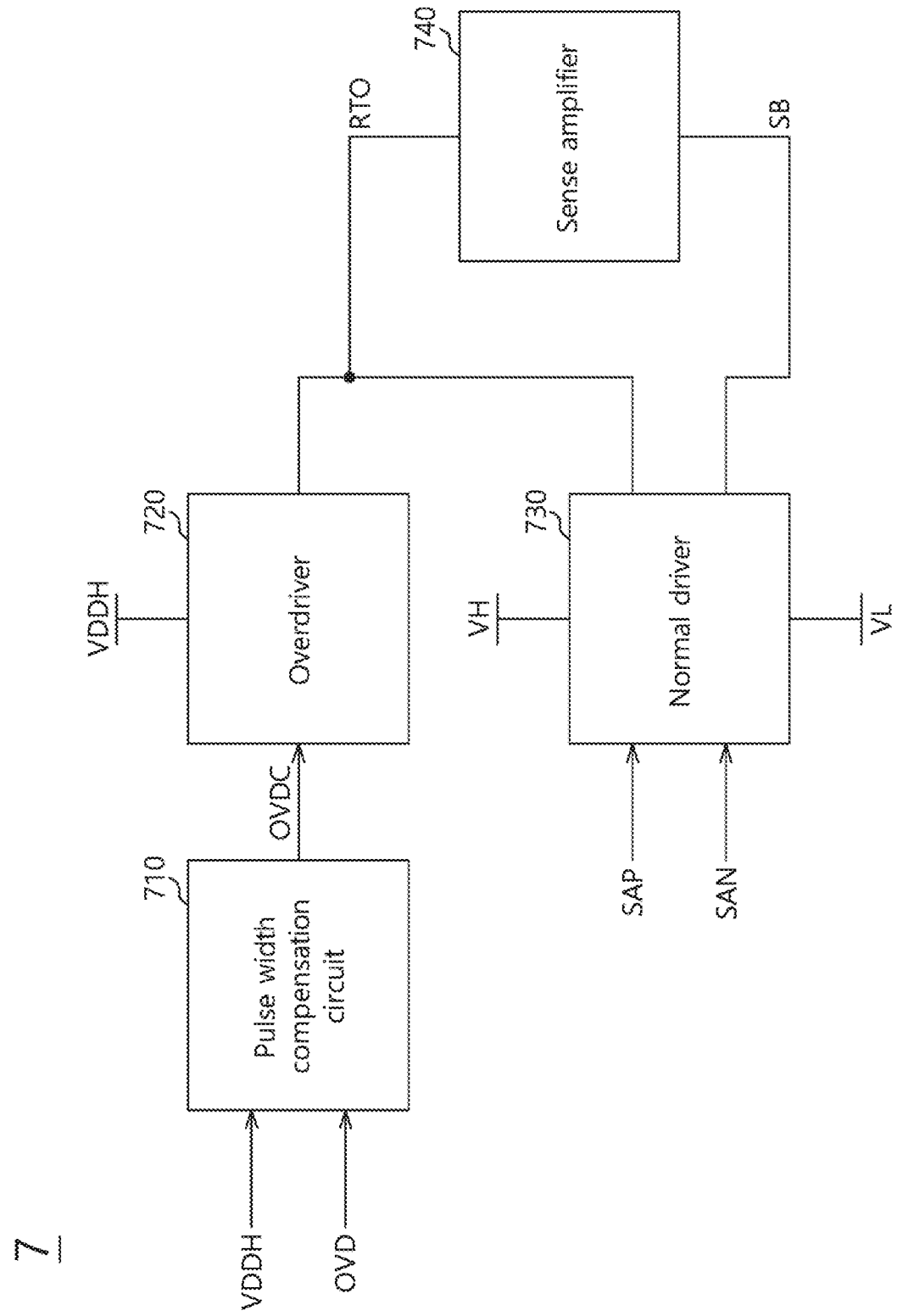

PULSE WIDTH COMPENSATION CIRCUIT AND A SEMICONDUCTOR APPARATUS USING THE PULSE WIDTH COMPENSATION CIRCUIT

CROSS-REFERENCES TO RELATED APPLICATION

The present application claims priority under 35 U.S.C. § 119(a) to Korean application number 10-2018-0045634, filed on Apr. 19, 2018, in the Korean Intellectual Property Office, which is incorporated herein by reference in its entirety.

BACKGROUND

1. Technical Field

Various embodiments generally relate to a semiconductor technology, and, more particularly, to a pulse width compensation circuit and a semiconductor apparatus using a pulse width compensation circuit.

2. Related Art

Each of electronic apparatuses may include a large number of electronic components. Among the electronic apparatuses, a computer system may include a large number of semiconductor apparatuses which are constructed using semiconductors. The semiconductor apparatuses may operate by receiving a power supply voltage from an external power source. Power supply voltages having various voltage levels may be used depending on the kind of a semiconductor apparatus. An electronic apparatus may include a component such as a power management integrated circuit to generate various power supply voltages.

In general, semiconductor apparatuses may include a large number of internal circuits, and the internal circuits may be designed to operate based on the normal state voltage levels of power supply voltages. However, the voltage levels of the power supply voltages may vary depending on various factors and might not maintain normal states. When internal circuits operate based on varied power supply voltages, the internal circuits may not perform as designed.

SUMMARY

In accordance with the present teachings, a pulse width compensation circuit includes a voltage control circuit and a pulse width adjustment circuit. The voltage control circuit is configured to generate a voltage control signal by sensing a voltage level of a first power supply voltage. The pulse width adjustment circuit is configured to generate an output signal by changing a pulse width of an input signal based on the voltage control signal.

Also in accordance with the present teachings, a semiconductor apparatus includes a pulse width compensation circuit and an internal circuit. The pulse width compensation circuit is configured to receive an input signal, sense a voltage level of a first power supply voltage, and generate an output signal by changing a pulse width of the input signal depending on a sensing result. The internal circuit is configured to operate based on the output signal.

Further in accordance with the present teachings, a pulse width compensation circuit includes a voltage control circuit and a pulse width adjustment circuit. The voltage control circuit is configured to sense a voltage level of a first power supply voltage. The pulse width adjustment circuit is configured to receive an input signal, generate an output signal which has a first pulse width when the voltage level of the first power supply voltage is at a first voltage level, and generate the output signal which has a second pulse width as the voltage level of the first power supply voltage is at a second voltage level. Here, the first pulse width is narrower than the second pulse width and the first voltage level is greater than the second voltage level.

BRIEF DESCRIPTION OF THE DRAWINGS

FIGS. 4A and 4B show diagrams illustrating configurations of pulse width adjustment circuits in accordance with embodiments.

FIG. 7 shows a diagram illustrating a configuration of a semiconductor apparatus in accordance with an embodiment.

DETAILED DESCRIPTION

A pulse width compensation circuit and a semiconductor apparatus using the same are described below with reference to the accompanying drawings through various examples of embodiments.

Figure 1:
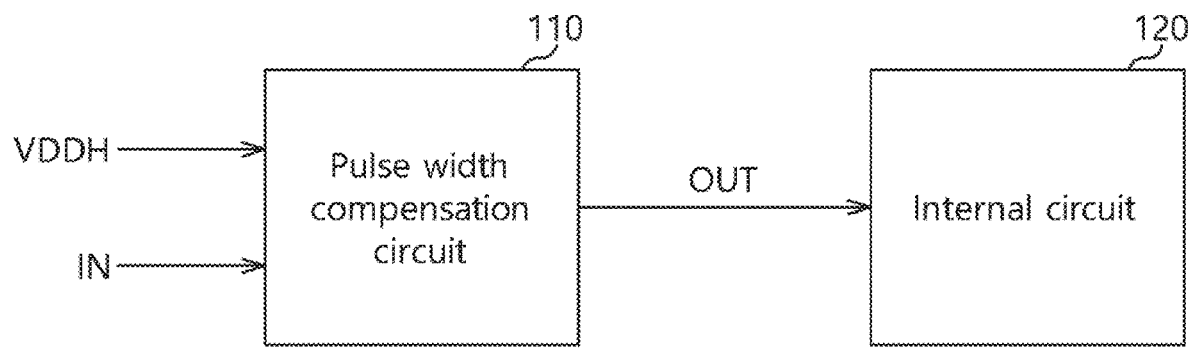
FIG. 1 shows a diagram illustrating a configuration of a semiconductor apparatus in accordance with an embodiment.

FIG. 1 shows a diagram illustrating a configuration of a semiconductor apparatus 1 in accordance with an embodiment. In FIG. 1, the semiconductor apparatus 1 may perform a predetermined operation based on an input signal IN. The predetermined operation may be an operation of driving a certain signal line or at least one element. The semiconductor apparatus 1 may sense the voltage level of a power supply voltage, and may compensate for the pulse width of the input signal IN depending on a voltage level variation of the power supply voltage. If the pulse width of the input signal IN is compensated for depending on the voltage level of the power supply voltage, the semiconductor apparatus 1 may exhibit constant performance.

As shown in FIG. 1, the semiconductor apparatus 1 may include a pulse width compensation circuit 110 and an internal circuit 120. The pulse width compensation circuit 110 may receive the input signal IN and output an output signal OUT. The input signal IN may be a certain operation control signal for operating the internal circuit 120. The pulse width compensation circuit 110 may receive a first power supply voltage VDDH. The semiconductor apparatus 1 may operate by receiving the first power supply voltage VDDH and a second power supply voltage. The first power supply voltage VDDH may be a high voltage. The second power supply voltage may be a low voltage which has a voltage level lower than the first power supply voltage VDDH. The second power supply voltage may be, for example, a ground voltage. The second power supply voltage will be described later. The pulse width compensation circuit 110 may sense the voltage level of the first power supply voltage VDDH, and may generate the output signal OUT by variously changing the pulse width of the input signal IN depending on a sensing result. For example, the pulse width compensation circuit 110 may generate the output signal OUT by decreasing the pulse width of the input signal IN when the voltage level of the first power supply voltage VDDH is high, and may generate the output signal OUT by increasing the pulse width of the input signal IN when the voltage level of the first power supply voltage VDDH is low. Therefore, the output signal OUT may have a relatively narrow pulse width when the voltage level of the first power supply voltage VDDH is high, and may have a relatively wide pulse width when the voltage level of the first power supply voltage VDDH is low.

The internal circuit 120 may include any kind of circuit which is included in the semiconductor apparatus 1. The internal circuit 120 may receive the output signal OUT and may operate based on the output signal OUT. The internal circuit 120 may perform, for example, a function of driving a signal line or supply an operating voltage to at least one element. For example, the internal circuit 120 may include any driver circuit. The internal circuit 120 may perform a driving operation based on the output signal OUT having a relatively narrow pulse width when the voltage level of the first power supply voltage VDDH is high, and may perform a driving operation based on the output signal OUT having a relatively wide pulse width when the voltage level of the first power supply voltage VDDH is low. Thus, because the driving operation may be performed for a relatively short time when the voltage level of the first power supply voltage VDDH is high and the driving operation may be performed for a relatively long time when the voltage level of the first power supply voltage VDDH is low, results of performing the driving operations may be substantially the same regardless of a variation in the voltage level of the first power supply voltage VDDH.

Figure 2:
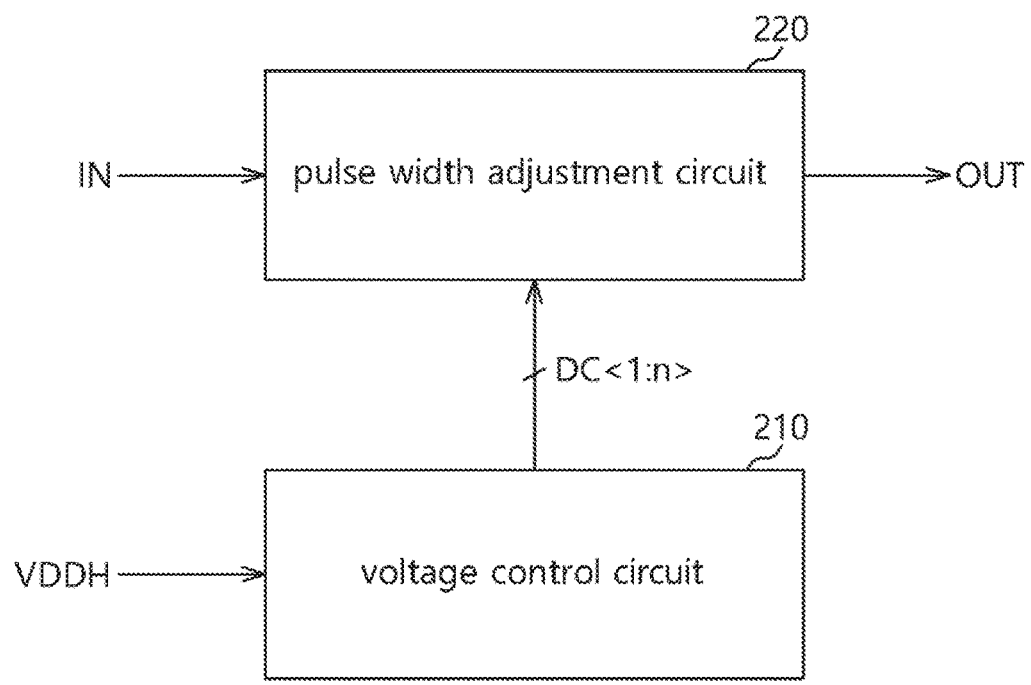
FIG. 2 shows a diagram illustrating a configuration of a pulse width compensation circuit in accordance with an embodiment.

FIG. 2 shows a diagram of a configuration of a pulse width compensation circuit 200 in accordance with an embodiment. The pulse width compensation circuit 200 may be applied as the pulse width compensation circuit 110 shown in FIG. 1. In FIG. 2, the pulse width compensation circuit 200 may include a voltage control circuit 210 and a pulse width adjustment circuit 220. The voltage control circuit 210 may receive a first power supply voltage VDDH. The voltage control circuit 210 may generate voltage control signals DC<1:n> by sensing the voltage level of the first power supply voltage VDDH. The voltage control circuit 210 may include a voltage comparator which compares the voltage level of the first power supply voltage VDDH with a target voltage level. The voltage control circuit 210 may generate the voltage control signals DC<1:n> by comparing the voltage level of the first power supply voltage VDDH and the target voltage level. The target voltage level may be set to a predetermined voltage level to allow determination of whether the voltage level of the first power supply voltage VDDH is higher or lower than a reference voltage. The voltage control signals DC<1:n> may include a plurality of bits. For example, the voltage control circuit 210 may set a predetermined bit to a logic high level when the voltage level of the first power supply voltage VDDH is near the target voltage level. The voltage control circuit 210 may increase the number of bits having a logic high level when the voltage level of the first power supply voltage VDDH is high, and may increase the number of bits having a logic low level when the voltage level of the first power supply voltage VDDH is low.

The pulse width adjustment circuit 220 may receive an input signal IN and the voltage control signals DC<1:n> and may output an output signal OUT. The pulse width adjustment circuit 220 may generate the output signal OUT based on the input signal IN and may adjust the pulse width of the output signal OUT based on the voltage control signals DC<1:n>. The pulse width adjustment circuit 220 may generate the output signal OUT by changing the enable period of the input signal IN based on the voltage control signals DC<1:n>. When the input signal IN is enabled to a low level, the pulse width adjustment circuit 220 may generate the output signal OUT in which a low voltage level period is decreased or increased from the input signal IN, based on the voltage control signals DC<1:n>. When the input signal IN is enabled to a high level, the pulse width adjustment circuit 220 may generate the output signal OUT in which a high voltage level period is decreased or increased from the input signal IN, based on the voltage control signals DC<1:n>. If the low voltage level period or the high voltage level period is decreased, the pulse width of the output signal OUT may be decreased. If the low voltage level period or the high voltage level period is increased, the pulse width of the output signal OUT may be increased.

Figure 3:
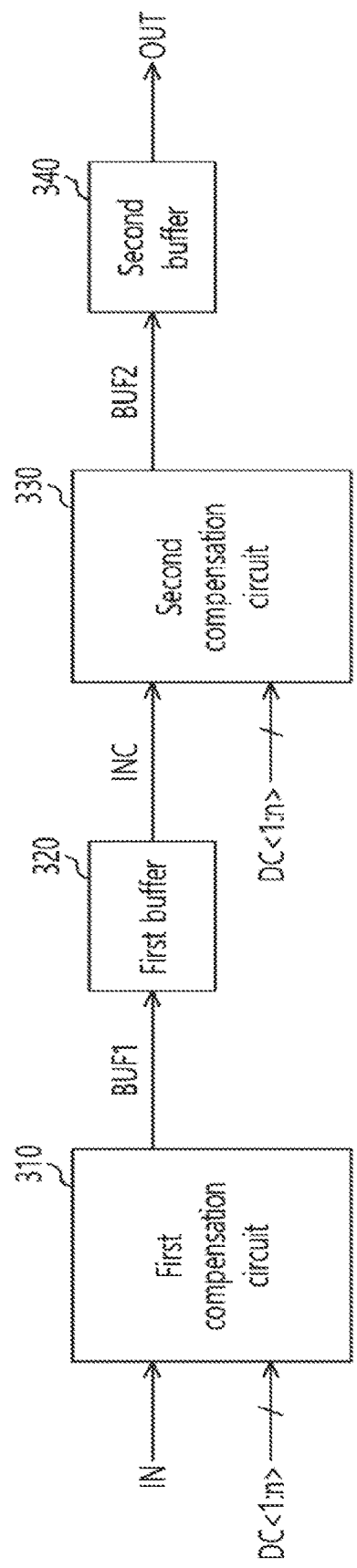
FIG. 3 shows a diagram illustrating a configuration of a pulse width adjustment circuit in accordance with an embodiment.

FIG. 3 shows a diagram illustrating a configuration of a pulse width adjustment circuit 300 in accordance with an embodiment. The pulse width adjustment circuit 300 may be applied as the pulse width adjustment circuit 220 shown in FIG. 2. As shown in FIG. 3, the pulse width adjustment circuit 300 may include a first compensation circuit 310, a first buffer 320, a second compensation circuit 330, and a second buffer 340. The first compensation circuit 310 may receive an input signal IN and voltage control signals DC<1:n>. The first compensation circuit 310 may generate a first buffer control signal BUF1 from the input signal IN. The first compensation circuit 310 may change one of the low voltage level and the high voltage level of the first buffer control signal BUF1 based on the voltage control signals DC<1:n>. For example, the first compensation circuit 310 may raise or lower the low voltage level of the first buffer control signal BUF1 based on the voltage control signals DC<1:n>. The first buffer 320 may be coupled between the first compensation circuit 310 and the second compensation circuit 330. The first buffer 320 may buffer the first buffer control signal BUF1 outputted from the first compensation circuit 310 and output a compensation signal INC. The first buffer 320 may be changed in amplification timing based on the first buffer control signal BUF1. The first buffer 320 may provide the compensation signal INC to the second compensation circuit 330.

The second compensation circuit 330 may receive the compensation signal INC and the voltage control signals DC<1:n>. The second compensation circuit 330 may generate a second buffer control signal BUF2 from the compensation signal INC. The second compensation circuit 330 may change one of the high voltage level and the low voltage level of the second buffer control signal BUF2 based on the voltage control signals DC<1:n>. The second compensation circuit 330 may change a voltage level complementary to a voltage level which is changed by the first compensation circuit 310. For example, the second compensation circuit 330 may raise or lower the high voltage level of the second buffer control signal BUF2 based on the voltage control signals DC<1:n>. In an embodiment, a modification may be made such that the first compensation circuit 310 changes the high voltage level of the first buffer control signal BUF1 and the second compensation circuit 330 changes the low voltage level of the second buffer control signal BUF2. The second buffer 340 may receive the second buffer control signal BUF2 outputted from the second compensation circuit 330. The second buffer 340 may buffer the second buffer control signal BUF2 and output an output signal OUT. The second buffer 340 may be changed in amplification timing based on the second buffer control signal BUF2.

Figure 4B:
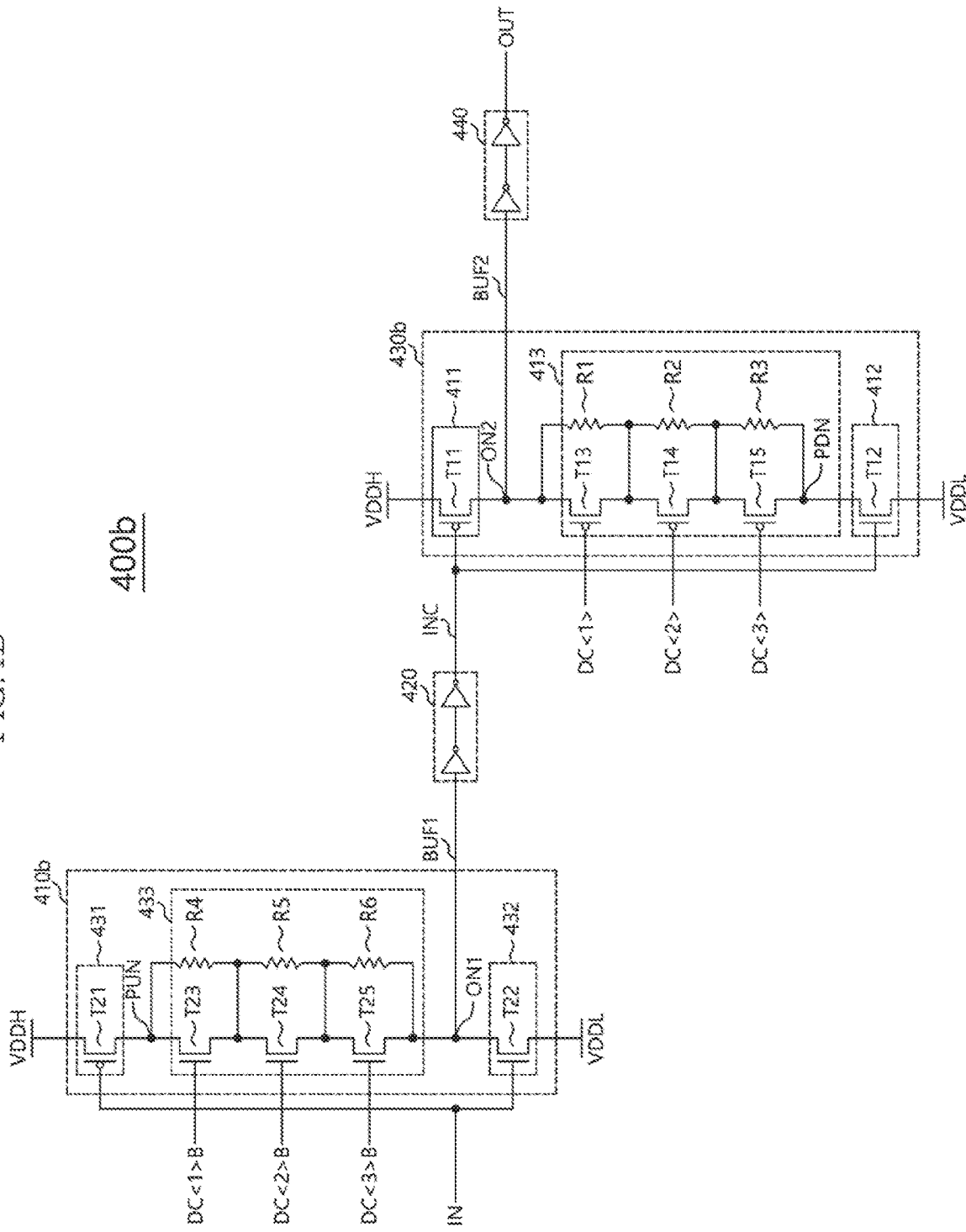

FIGS. 4A and 4B show diagrams illustrating configurations of pulse width adjustment circuits in accordance with embodiments. Pulse width adjustment circuits 400a and 400b shown in FIGS. 4A and 4B, respectively, may be applied as the pulse width adjustment circuit 220 shown in FIG. 2. As shown in FIG. 4A, the pulse width adjustment circuit 400a may include a first compensation circuit 410a, a first buffer 420, a second compensation circuit 430a, and a second buffer 440. The first and second compensation circuits 410a and 430a may be respectively applied as the first and second compensation circuits 310 and 330 shown in FIG. 3. The first compensation circuit 410a may change the low voltage level of a first buffer control signal BUF1. The first compensation circuit 410a may include a first pull-up driver 411, a first pull-down driver 412, and a low voltage level raising circuit 413. The first pull-up driver 412 may receive an input signal IN and may drive a first output node ON1 to a first power supply voltage VDDH based on the input signal IN. The first pull-down driver 412 may receive the input signal IN, and may drive a pull-down node PDN to a second power supply voltage VDDL based on the input signal IN. The low voltage level raising circuit 413 may receive voltage control signals DC<1:3>, and may be coupled between the first output node ON1 and the pull-down node PDN. The low voltage level raising circuit 413 may raise the voltage level of the pull-down node PDN based on the voltage control signals DC<1:3>, and may provide the raised voltage to the first output node ON1. The low voltage level raising circuit 413 may cause the first output node ON1 to be driven to a voltage level higher than the pull-down node PDN, based on the voltage control signals DC<1:3>. The first buffer control signal BUF1 may be outputted from the first output node ON1.

The first buffer 420 may receive the first buffer control signal BUF1 and generate a compensation signal INC. The first buffer 420 may be changed in amplification timing based on the first buffer control signal BUF1. The first buffer 420 may adjust the pulse width of the compensation signal INC depending on the amplification timing. For example, the compensation signal INC having a narrow pulse width may be generated when the amplification timing of the first buffer 420 is early, and the compensation signal INC having a wide pulse width may be generated when the amplification timing of the first buffer 420 is late. The first buffer 420 may provide the compensation signal INC to the second compensation circuit 430a. The first buffer 420 may include an even number of inverters. For FIG. 4A, an embodiment is illustrated in which the first buffer 420 includes two inverters.

The second compensation circuit 430a may change the high voltage level of a second buffer control signal BUF2. The second compensation circuit 430a may include a second pull-up driver 431, a second pull-down driver 432, and a high voltage level lowering circuit 433. The second pull-up driver 431 may receive the compensation signal INC, and may drive a pull-up node PUN to the first power supply voltage VDDH based on the compensation signal INC. The second pull-down driver 432 may receive the compensation signal INC and may drive a second output node ON2 to the second power supply voltage VDDL based on the compensation signal INC. The high voltage level lowering circuit 433 may receive the voltage control signals DC<1:3>, and may be coupled between the pull-up node PUN and the second output node ON2. The high voltage level lowering circuit 433 may lower the voltage level of the pull-up node PUN based on the voltage control signals DC<1:3>, and may provide the lowered voltage to the second output node ON2. The high voltage level lowering circuit 433 may cause the second output node ON2 to be driven to a voltage level lower than the pull-up node PUN, based on the voltage control signals DC<1:3>. The second buffer control signal BUF2 may be outputted from the second output node ON2.

The second buffer 440 may receive the second buffer control signal BUF2 and generate an output signal OUT. The second buffer 440 may be changed in amplification timing based on the second buffer control signal BUF2. The second buffer 440 may adjust the pulse width of the output signal OUT depending on the amplification timing. For example, the output signal OUT having a narrow pulse width may be generated when the amplification timing of the second buffer 440 is early, and the output signal OUT having a wide pulse width may be generated when the amplification timing of the second buffer 440 is late. The second buffer 440 may include an even number of inverters. The second buffer 440 may include the same number of inverters as the first buffer 420. In FIG. 4A, it is illustrated that the second buffer 440 includes two inverters.

In FIG. 4A, the first pull-up driver 411 may include a first transistor T11. The first transistor T11 may be a P-channel MOS transistor. The first transistor T11 may have a gate which receives the input signal IN, a source which is coupled with the terminal of the first power supply voltage VDDH, and a drain which is coupled with the first output node ON1. The first pull-down driver 412 may include a second transistor T12. The second transistor T12 may be an N-channel MOS transistor. The second transistor T12 may have a gate which receives the input signal IN, a drain which is coupled with the pull-down node PDN, and a source which is coupled with the terminal of the second power supply voltage VDDL. The low voltage level raising circuit 413 may include a plurality of transistors which are coupled between the first output node ON1 and the pull-down node PDN. The low voltage level raising circuit 413 may include a plurality of resistors which are coupled between the first output node ON1 and the pull-down node PDN and are coupled in parallel with the plurality of transistors. For example, the low voltage level raising circuit 413 may include a third transistor T13, a fourth transistor T14, and a fifth transistor T15, and may include a first resistor R1, a second resistor R2, and a third resistor R3. While FIG. 4A illustrates that the low voltage level raising circuit 413 includes three transistors and three resistors and receives the voltage control signals DC<1:3> of 3 bits, it is to be noted that each of the numbers of transistors and resistors may be less or greater than three. The third to fifth transistors T13, T14, and T15 may be the same type of transistors, and may be, for example, P-channel MOS transistors. The third to fifth transistors T13, T14, and T15 may have the same size and may be the same in turn-on resistance value.

The third transistor T13 may have a gate which receives the assigned voltage control signal DC<1> and a source which is coupled with the first output node ON1. The fourth transistor T14 may have a gate which receives the assigned voltage control signal DC<2> and a source which is coupled with the drain of the third transistor T13. The fifth transistor T15 may have a gate which receives the assigned voltage control signal DC<3>, a source which is coupled with the drain of the fourth transistor T14, and a drain which is coupled with the pull-down node PDN. The first resistor R1 may have one end which is coupled in common with the first output node ON1 and the source of the third transistor T13 and the other end which is coupled in common with the drain of the third transistor T13 and the source of the fourth transistor T14. The second resistor R2 may have one end which is coupled in common with the drain of the third transistor T13 and the source of the fourth transistor T14 and the other end which is coupled in common with the drain of the fourth transistor T14 and the source of the fifth transistor T15. The third resistor R3 may have one end which is coupled in common with the drain of the fourth transistor T14 and the source of the fifth transistor T15 and the other end which is coupled in common with the drain of the fifth transistor T15 and the pull-down node PDN.

In FIG. 4A, the second pull-up driver 431 may include a sixth transistor T21. The sixth transistor T21 may be a P-channel MOS transistor. The sixth transistor T21 may have a gate which receives the compensation signal INC, a source which is coupled with the terminal of the first power supply voltage VDDH, and a drain which is coupled with the pull-up node PUN. The second pull-down driver 432 may include a seventh transistor T22. The seventh transistor T22 may be an N-channel MOS transistor. The seventh transistor T22 may have a gate which receives the compensation signal INC, a drain which is coupled with the second output node ON2, and a source which is coupled with the terminal of the second power supply voltage VDDL. The high voltage level lowering circuit 433 may include a plurality of transistors which are coupled between the pull-up node PUN and the second output node ON2. The high voltage level lowering circuit 433 may include a plurality of resistors which are coupled between the pull-up node PUN and the second output node ON2 and are coupled in parallel with the plurality of transistors. For example, the high voltage level lowering circuit 433 may include an eighth transistor T23, a ninth transistor T24, and a tenth transistor T25, and may include a fourth resistor R4, a fifth resistor R5, and a sixth resistor R6. The eighth to tenth transistors T23, T24, and T25 may be the same type of transistors, and may be, for example, N-channel MOS transistors. The eighth to tenth transistors T23, T24, and T25 may have the same size and may be the same in turn-on resistance value. The numbers of transistors and resistors included in the high voltage level lowering circuit 433 may be the same as the numbers of transistors and resistors included in the low voltage level raising circuit 413.

The eighth transistor T23 may have a gate which receives a complementary signal DC<1>B of the assigned voltage control signal DC<1> and a drain which is coupled with the pull-up node PUN. The ninth transistor T24 may have a gate which receives a complementary signal DC<2>B of the assigned voltage control signal DC<2> and a drain which is coupled with the source of the eighth transistor T23. The tenth transistor T25 may have a gate which receives a complementary signal DC<3>B of the assigned voltage control signal DC<3>, a drain which is coupled with the source of the ninth transistor T24, and a source which is coupled with the second output node ON2. The fourth resistor R4 may have one end which is coupled in common with the pull-up node PUN and the drain of the eighth transistor T23 and the other end which is coupled in common with the source of the eighth transistor T23 and the drain of the ninth transistor T24. The fifth resistor R5 may have one end which is coupled in common with the source of the eighth transistor T23 and the drain of the ninth transistor T24 and the other end which is coupled in common with the source of the ninth transistor T24 and the drain of the tenth transistor T25. The sixth resistor R6 may have one end which is coupled in common with the source of the ninth transistor T24 and the drain of the tenth transistor T25 and the other end which is coupled in common with the source of the tenth transistor T25 and the second output node ON2.

For an embodiment, the resistance values of the first to sixth resistors R1, R2, R3, R4, R5, and R6 may be smaller than the turn-on resistance values of the third to fifth transistors T13, T14, and T15 and the eighth to tenth transistors T23, T24, and T25. The first to third resistors R1, R2, and R3 may bypass a current path from the first output node ON1 to the pull-down node PDN when the third to fifth transistors T13, T14, and T15 are turned off. The fourth to sixth resistors R4, R5, and R6 may bypass a current path from the pull-up node PUN to the second output node ON2 when the eighth to tenth transistors T23, T24, and T25 are turned off. Because the third to fifth transistors T13, T14, and T15 are P-channel MOS transistors, when they are turned on based on the voltage control signals DC<1:3>, they may provide a voltage raised by threshold voltages from the voltage level of the pull-down node PDN to the first output node ON1. For example, when all of the third to fifth transistors T13, T14, and T15 are turned off, a voltage substantially the same as the voltage of the pull-down node PDN may be provided to the first output node ON1, and, when all of the third to fifth transistors T13, T14, and T15 are turned on, a voltage raised by the threshold voltages of the third to fifth transistors T13, T14, and T15 from the voltage level of the pull-down node PDN may be provided to the first output node ON1. Since the eighth to tenth transistors T23, T24, and T25 are N-channel MOS transistors, when they are turned on based on the voltage control signals DC<1:3>, they may provide a voltage lowered by threshold voltages from the voltage level of the pull-up node PUN, to the second output node ON2. For example, when all of the eighth to tenth transistors T23, T24, and T25 are turned off, a voltage substantially the same as the voltage of the pull-up node PUN may be provided to the second output node ON2, and, when all of the eighth to tenth transistors T23, T24, and T25 are turned on, a voltage lowered by the threshold voltages of the eighth to tenth transistors T23, T24, and T25 from the voltage level of the pull-up node PUN may be provided to the second output node ON2.

FIG. 4B illustrates an embodiment of a pulse width adjustment circuit 400b which is modified such that a first compensation circuit 410b changes the high voltage level of a first buffer control signal BUF1 and a second compensation circuit 430b changes the low voltage level of a second buffer control signal BUF2. When compared to the first and second compensation circuits 410a and 430a of FIG. 4A, the first and second compensation circuits 410b and 430b of FIG. 4B may have the same configurations with the exception that input signals and output signals are different. The first compensation circuit 410b may have the same components and operate in the same manner as the second compensation circuit 430a of FIG. 4A. The second compensation circuit 430b may have the same components and operate in the same manner as the first compensation circuit 410a shown in FIG. 4A. Repeated descriptions for the same components are omitted herein.

Figure 5A:
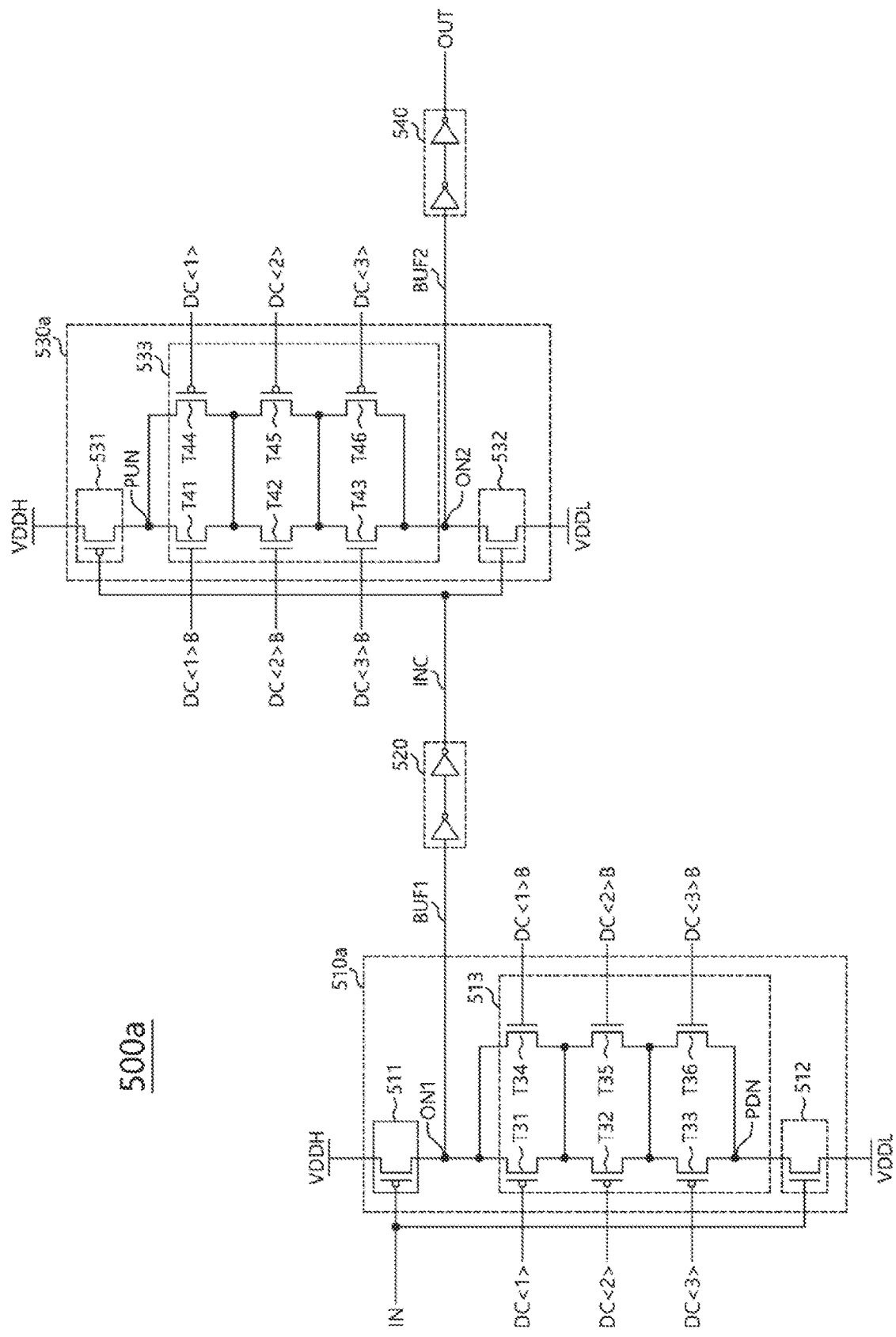
FIGS. 5A and 5B show diagrams illustrating configurations of the pulse width adjustment circuits in accordance with embodiments.
Figure 5B:
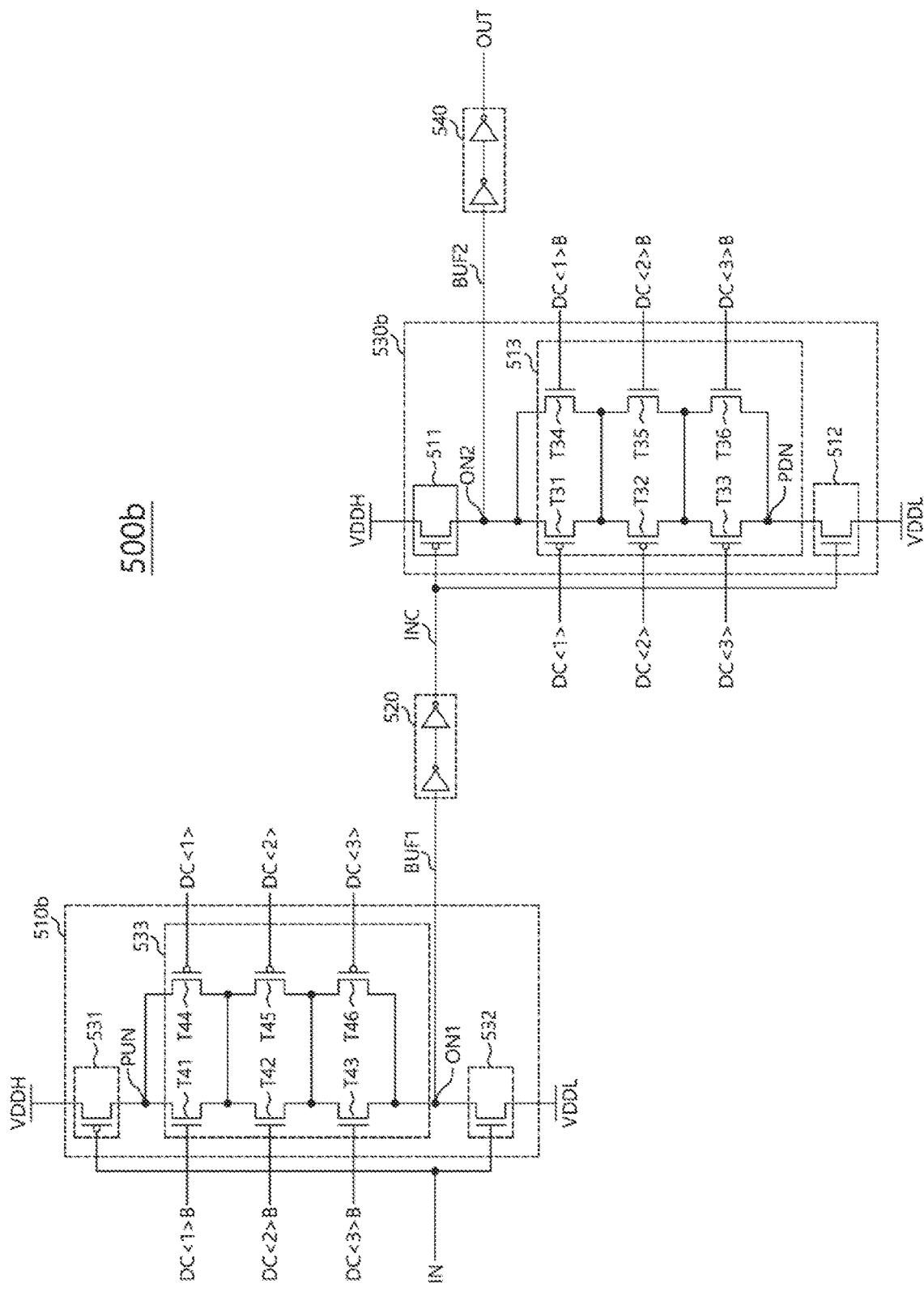

FIGS. 5A and 5B show diagrams illustrating configurations of pulse width adjustment circuits in accordance with different embodiments. Pulse width adjustment circuits 500a and 500b shown in FIGS. 5A and 5B, respectively, may be applied as the pulse width adjustment circuit 220 shown in FIG. 2. The pulse width adjustment circuit 500a shown in FIG. 5A may include a first compensation circuit 510a, a first buffer 520, a second compensation circuit 530a, and a second buffer 540. The first compensation circuit 510a may receive an input signal IN and generate a first buffer control signal BUF1, and the first buffer 520 may generate a compensation signal INC based on the first buffer control signal BUF1. The second compensation circuit 530a may generate a second buffer control signal BUF2 based on the compensation signal INC, and the second buffer 540 may generate an output signal OUT based on the second buffer control signal BUF2. The first compensation circuit 510a may change the low voltage level of the first buffer control signal BUF1. The first compensation circuit 510a may include a first pull-up driver 511, a first pull-down driver 512, and a low voltage level raising circuit 513. The second compensation circuit 530a may change the high voltage level of the second buffer control signal BUF2. The second compensation circuit 530a may include a second pull-up driver 531, a second pull-down driver 532, and a high voltage level lowering circuit 533. The pulse width adjustment circuit 500a may have the same configuration as the pulse width adjustment circuit 400a shown in FIG. 4A except for the configurations of the low voltage level raising circuit 513 and the high voltage level lowering circuit 533. Repeated descriptions for the same components are omitted herein.

The low voltage level raising circuit 513 may include a plurality of transistors which are coupled between a first output node ON1 and a pull-down node PDN and are turned on based on voltage control signals DC<1:3>. The low voltage level raising circuit 513 may include another plurality of transistors which are coupled between the first output node ON1 and the pull-down node PDN and are coupled in parallel with the plurality of transistors. This plurality of transistors may be respectively turned on based on the complementary signals DC<1:3>B of the voltage control signals DC<1:3>. The low voltage level raising circuit 513 may include a first transistor T31, a second transistor T32, a third transistor T33, a fourth transistor T34, a fifth transistor T35, and a sixth transistor T36. The first to third transistors T31, T32, and T33 may be the same type of transistors. The fourth to sixth transistors T34, T35, and T36 may be the same type of transistors, and may be a different type from the type of the first to third transistors T31, T32, and T33. For example, the first to third transistors T31, T32, and T33 may be P-channel MOS transistors, and the fourth to sixth transistors T34, T35, and T36 may be N-channel MOS transistors. The first transistor T31 may have a gate which receives the assigned voltage control signal DC<1> and a source which is coupled with the first output node ON1. The second transistor T32 may have a gate which receives the assigned voltage control signal DC<2> and a source which is coupled with the drain of the first transistor T31. The third transistor T33 may have a gate which receives the assigned voltage control signal DC<3>, a source which is coupled with the drain of the second transistor T32, and a drain which is coupled with the pull-down node PDN. The fourth transistor T34 may have a gate which receives the complementary signal DC<1>B of the assigned voltage control signal DC<1>, a drain which is coupled with the first output node ON1, and a source which is coupled with the drain of the first transistor T31. The fifth transistor T35 may have a gate which receives the complementary signal DC<2>B of the assigned voltage control signal DC<2>, a drain which is coupled with the source of the fourth transistor T34, and a source which is coupled with the drain of the second transistor T32. The sixth transistor T36 may have a gate which receives the complementary signal DC<3>B of the assigned voltage control signal DC<3>, a drain which is coupled with the source of the fifth transistor T35, and a source which is coupled with the pull-down node PDN. Because the first to third transistors T31, T32, and T33 are P-channel MOS transistors, when they are turned on, they may raise the voltage level of the pull-down node PDN by threshold voltages and provide a raised voltage to the first output node ON1. On the other hand, because the fourth to sixth transistors T34, T35, and T36 are N-channel MOS transistors, when they are turned on, they may not substantially raise the voltage level of the pull-down node PDN and provide it to the first output node ON1.

The high voltage level lowering circuit 533 may include a plurality of transistors which are coupled between a pull-up node PUN and a second output node ON2 and are turned on based on the voltage control signals DC<1:3>. The plurality of transistors may be respectively turned on based on the complementary signals DC<1:3>B of the voltage control signals DC<1:3>. The high voltage level lowering circuit 533 may include another plurality of transistors which are coupled between the pull-up node PUN and the second output node ON2 and are coupled in parallel with the plurality of transistors. This plurality of transistors may be respectively turned on based on the voltage control signals DC<1:3>. The high voltage level lowering circuit 533 may include a seventh transistor T41, an eighth transistor T42, a ninth transistor T43, a tenth transistor T44, an eleventh transistor T45, and a twelfth transistor T46. The seventh to ninth transistors T41, T42, and T43 may be the same type of transistors. The tenth to twelfth transistors T44, T45, and T46 may be the same type of transistors, and may be a different type from the type of the seventh to ninth transistors T41, T42, and T43. For example, the seventh to ninth transistors T41, T42, and T43 may be N-channel MOS transistors, and the tenth to twelfth transistors T44, T45, and T46 may be P-channel MOS transistors. The seventh transistor T41 may have a gate which receives the complementary signal DC<1>B of the assigned voltage control signal DC<1> and a drain which is coupled with the pull-up node PUN. The eighth transistor T42 may have a gate which receives the complementary signal DC<2>B of the assigned voltage control signal DC<2> and a drain which is coupled with the source of the seventh transistor T41. The ninth transistor T43 may have a gate which receives the complementary signal DC<3>B of the assigned voltage control signal DC<3>, a drain which is coupled with the source of the eighth transistor T42, and a source which is coupled with the second output node ON2. The tenth transistor T44 may have a gate which receives the assigned voltage control signal DC<1>, a source which is coupled with the pull-up node PUN, and a drain which is coupled with the source of the seventh transistor T41. The eleventh transistor T45 may have a gate which receives the assigned voltage control signal DC<2>, a source which is coupled with the drain of the tenth transistor T44, and a drain which is coupled with the source of the eighth transistor T42, The twelfth transistor T46 may have a gate which receives the assigned voltage control signal DC<3>, a source which is coupled with the drain of the eleventh transistor T45, and a drain which is coupled with the second output node ON2. Because the seventh to ninth transistors T41, T42, and T43 are N-channel MOS transistors, when they are turned on, they may lower the voltage level of the pull-up node PUN by the threshold voltages of the seventh to ninth transistors T41, T42, and T43 and provide a lowered voltage to the second output node ON2. On the other hand, because the tenth to twelfth transistors T44, T45, and T46 are P-channel MOS transistors, when they are turned on, they might not substantially lower the voltage level of the pull-up node PUN and provide it to the second output node ON2.

FIG. 5B illustrates an embodiment of a pulse width adjustment circuit 500b which is modified such that a first compensation circuit 510b changes the high voltage level of a first buffer control signal BUF1 and a second compensation circuit 530b changes the low voltage level of a second buffer control signal BUF2. When compared to the first and second compensation circuits 510a and 530a of FIG. 5A, the first and second compensation circuits 510b and 530b of FIG. 5B may have the same configurations with the exception that input signals and output signals are different. The first compensation circuit 510b may have the same components and operate in the same manner as the second compensation circuit 530a of FIG. 5A. The second compensation circuit 530b may have the same components and operate in the same manner as the first compensation circuit 510a shown in FIG. 5A. Repeated descriptions for the same components are omitted herein.

Figure 6A:
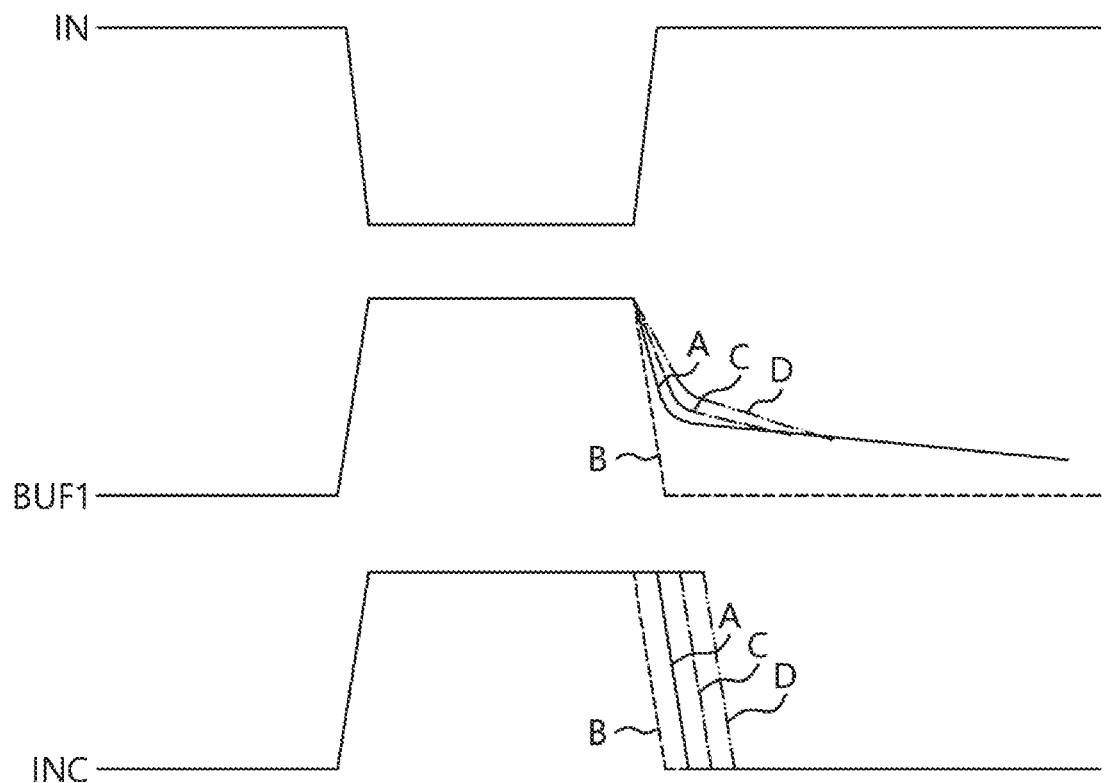
FIGS. 6A and 6B show diagrams to assist in the explanation of the operations of the pulse width compensation circuit and the semiconductor apparatus in accordance with the embodiments.
Figure 6B:
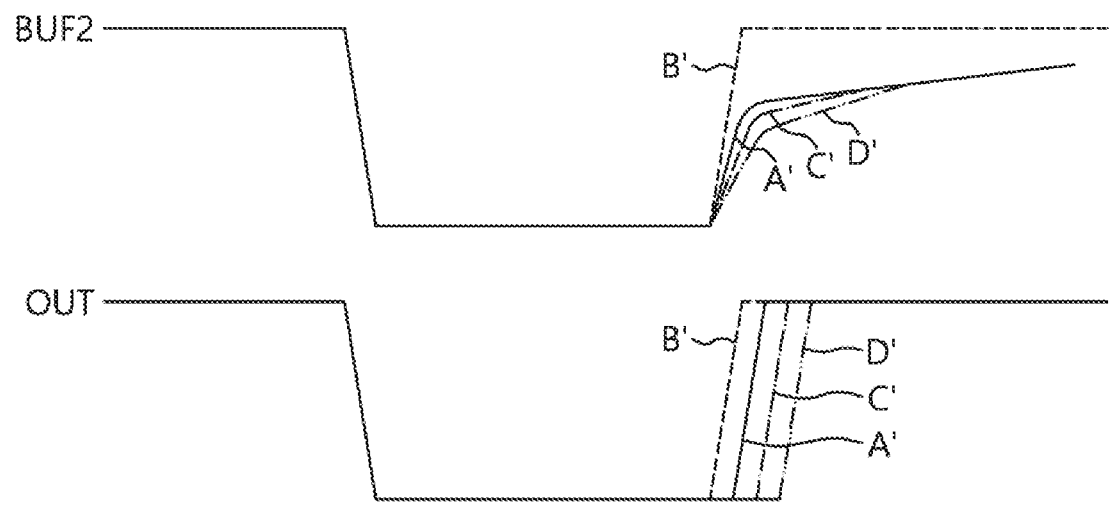

FIGS. 6A and 6B show diagrams to assist in the description of the operation of the pulse width adjustment circuit in accordance with an embodiment. The operations of the pulse width compensation circuits 110 and 200 and the semiconductor apparatus 1 in accordance with the embodiments are described below with reference to FIGS. 1 to 6B. Because the pulse width adjustment circuit 500a of FIG. 5A performs the same operation as the pulse width adjustment circuit 400a of FIG. 4A, the pulse width adjustment circuit 400a of FIG. 4A is representatively described below. When the voltage level of the first power supply voltage VDDH is near a target voltage level, the voltage control circuit 210 may generate the voltage control signals DC<1:3> such that the voltage control signal DC<1> has a logic low level and the remaining voltage control signals DC<2:3> have a logic high level. The third transistor T13 of the low voltage level raising circuit 413 may be turned on, and the fourth and fifth transistors T14 and T15 may be turned off. Therefore, the low voltage level raising circuit 413 may raise the voltage level of the pull-down node PDN by the threshold voltage of the third transistor T13, and may provide a raised voltage to the first output node ON1. Thus, the first buffer control signal BUF1 may have a waveform corresponding to A of FIG. 6A. When the voltage level of the first power supply voltage VDDH is higher than the target voltage level, the voltage control circuit 210 may generate the voltage control signals DC<1:3> such that all of the voltage control signals DC<1:3> have a logic high level. All of the third to fifth transistors T13, T14, and T15 of the low voltage level raising circuit 413 may be turned off, and the low voltage level raising circuit 413 might not substantially change the voltage level of the pull-down node PDN and provide a voltage substantially the same as the voltage level of the pull-down node PDN to the first output node ON1. Accordingly, the first buffer control signal BUF1 may have a waveform corresponding to B of FIG. 6A. When the voltage level of the first power supply voltage VDDH is lower than the target voltage level, the voltage control circuit 210 may generate the voltage control signals DC<1:3> such that the voltage control signals DC<1:2> have a logic low level and the voltage control signal DC<3> has a logic high level. The third and fourth transistors T13 and T14 of the low voltage level raising circuit 413 may be turned on, and the fifth transistor T15 may be turned off. Therefore, the low voltage level raising circuit 413 may raise the voltage level of the pull-down node PDN by the threshold voltages of the third and fourth transistors T13 and T14, and may provide a raised voltage to the first output node ON1. Thus, the first buffer control signal BUF1 may have a waveform corresponding to C of FIG. 6A. When the voltage level of the first power supply voltage VDDH is further lower than the target voltage level, the voltage control circuit 210 may generate the voltage control signals DC<1:3> such that all of the voltage control signals DC<1:3> have a logic low level. All of the third to fifth transistors T13, T14, and T15 of the low voltage level raising circuit 413 may be turned on. Therefore, the low voltage level raising circuit 413 may raise the voltage level of the pull-down node PDN by the threshold voltages of the third to fifth transistors T13, T14, and T15, and may provide a raised voltage to the first output node ON1. Thus, the first buffer control signal BUF1 may have a waveform corresponding to D of FIG. 6A. As the first buffer control signals BUF1 having different waveforms change the operating time of the first buffer 420, the compensation signals INC outputted from the first buffer 420 may have different pulse widths. For example, B may have a narrower pulse width than A, C may have a wider pulse width than A, and D may have a wider pulse width than C.

When the voltage level of the first power supply voltage VDDH is near the target voltage level, the voltage control circuit 210 may generate the voltage control signals DC<1:3> such that the voltage control signal DC<1> has a logic low level and the remaining voltage control signals DC<2:3> have a logic high level. The eighth transistor T23 of the high voltage level lowering circuit 433 may be turned on, and the ninth and tenth transistors T24 and T25 may be turned off. Therefore, the high voltage level lowering circuit 433 may lower the voltage level of the pull-up node PUN by the threshold voltage of the eighth transistor T23, and may provide a lowered voltage to the second output node ON2. Thus, the second buffer control signal BUF2 may have a waveform corresponding to A' of FIG. 6A. When the voltage level of the first power supply voltage VDDH is higher than the target voltage level, the voltage control circuit 210 may generate the voltage control signals DC<1:3> such that all of the voltage control signals DC<1:3> have a logic high level. All of the eighth to tenth transistors T23, T24, and T25 of the high voltage level lowering circuit 433 may be turned off, and the high voltage level lowering circuit 433 may not substantially change the voltage level of the pull-up node PUN and provide a voltage substantially the same as the voltage level of the pull-up node PUN to the second output node ON2. Thus, the second buffer control signal BUF2 may have a waveform corresponding to B' of FIG. 6A. When the voltage level of the first power supply voltage VDDH is lower than the target voltage level, the voltage control circuit 210 may generate the voltage control signals DC<1:3> such that the voltage control signals DC<1:2> have a logic low level and the remaining voltage control signal DC<3> has a logic high level. The eighth and ninth transistors T23 and T24 of the high voltage level lowering circuit 433 may be turned on, and the tenth transistor T25 may be turned off. Therefore, the high voltage level lowering circuit 433 may lower the voltage level of the pull-up node PUN by the threshold voltages of the eighth and ninth transistors T23 and T24, and may provide a lowered voltage to the second output node ON2. Thus, the second buffer control signal BUF2 may have a waveform corresponding to C of FIG. 6B. When the voltage level of the first power supply voltage VDDH is further lower than the target voltage level, the voltage control circuit 210 may generate the voltage control signals DC<1:3> such that all of the voltage control signals DC<1:3> have a logic low level. All of the eighth to tenth transistors T23, T24, and T25 of the high voltage level lowering circuit 433 may be turned on. Therefore, the high voltage level lowering circuit 433 may lower the voltage level of the pull-up node PUN by the threshold voltages of the eighth to tenth transistors T23, T24, and T25, and may provide a lowered voltage to the second output node ON2. Thus, the second buffer control signal BUF2 may have a waveform corresponding to D' of FIG. 6B. As the second buffer control signals BUF2 having different waveforms change the operating time of the second buffer 440, the output signals OUT outputted from the second buffer 440 may have different pulse widths. For example, B' may have a narrower pulse width than A', C' may have a wider pulse width than A', and D' may have a wider pulse width than C'. Because the internal circuit 120 receives the output signal OUT which has a pulse width changed depending on a voltage level variation of the first power supply voltage VDDH, from the pulse width compensation circuits 110 and 200, the internal circuit 120 may exhibit constant performance regardless of a voltage level variation of the first power supply voltage VDDH.

FIG. 7 shows a diagram illustrating a configuration of a semiconductor apparatus 7 in accordance with an embodiment. In FIG. 7, the semiconductor apparatus 7 may include a pulse width compensation circuit 710, an overdriver 720, a normal driver 730, and a sense amplifier 740. The overdriver 720, the normal driver 730, and the sense amplifier 740 may be applied as the internal circuit 120 shown in FIG. 1. The pulse width compensation circuit 710 may receive an overdrive signal OVD, and may generate a compensated overdrive signal OVDC, which has a pulse width changed depending on the voltage level of a first power supply voltage VDDH. The overdriver 720 may operate by receiving the first power supply voltage VDDH. The overdriver 720 may supply the first power supply voltage VDDH to a first power terminal RTO of the sense amplifier 740 when the compensated overdrive signal OVDC is enabled. The overdriver 720 may overdrive the first power terminal RTO of the sense amplifier 740 such that the sense amplifier 740 may operate quickly. The normal driver 730 may receive a first control signal SAP and a second control signal SAN. The normal driver 730 may operate between a high voltage VH and a low voltage VL. The high voltage VH may have, for example, a voltage level lower than the first power supply voltage VDDH and higher than the low voltage VL. The low voltage VL may be, for example, a ground voltage. The normal driver 730 may supply the high voltage VH to the first power terminal RTO of the sense amplifier 740 when the first control signal SAP is enabled, and may supply the low voltage VL to a second power terminal SB of the sense amplifier 740 when the second control signal SAN is enabled. The sense amplifier 740 may perform an amplifying operation by being supplied with voltages through the first power terminal RTO and the second power terminal SB from the overdriver 720 and the normal driver 730. As described above, the overdriver 720 may perform an overdriving operation by supplying the first power supply voltage VDDH having a voltage level higher than the high voltage VH to the first power terminal RTO of the sense amplifier 740 when the overdrive signal OVD is enabled. In the case where the voltage level of the first power supply voltage VDDH varies, the overdriving operation may not be performed normally. For example, in the case where the voltage level of the first power supply voltage VDDH is higher than a target voltage level, an excessive overdriving operation may be performed, and, in the case where the voltage level of the first power supply voltage VDDH is lower than the target voltage level, an insufficient overdriving operation may be performed. The pulse width compensation circuit 710 may generate the compensated overdrive signal OVDC of which the pulse width is changed depending on a voltage level variation of the first power supply voltage VDDH, such that the overdriver 720 may perform an overdriving operation of constant performance regardless of a voltage level variation of the first power supply voltage VDDH.

While various embodiments have been described above, it will be understood to those skilled in the art that the described embodiments are not exhaustive and serve as examples only. Accordingly, the pulse width compensation circuit and the semiconductor apparatus using the same, as described herein, should not be limited based on the described embodiments.

What is claimed is:

1. A pulse width compensation circuit comprising:
   a voltage control circuit configured to generate a voltage control signal by sensing a voltage level of a first power supply voltage;
   a first compensation circuit configured to generate a first buffer control signal based on an input signal, and configured to change any one of a low voltage level and a high voltage level of the first buffer control signal based on the voltage control signal;
   a first buffer configured to generate a compensation signal based on the first buffer control signal;
   a second compensation circuit configured to generate a second buffer control signal based on the compensation signal, and configured to change a voltage level which is complementary to a voltage level changed by the first compensation circuit, among a low voltage level and a high voltage level of the second buffer control signal, based on the voltage control signal; and
   a second buffer configured to generate an output signal based on the second buffer control signal.

2. The pulse width compensation circuit according to claim 1,
   wherein the first compensation circuit comprises:
   a first pull-up driver configured to pull-up drive a first output node to a voltage level of the first power supply voltage based on the input signal;
   a first pull-down driver configured to pull-down drive a pull-down node to a voltage level of a second power supply voltage based on the input signal; and
   a low voltage level raising circuit configured to raise a voltage level of the pull-down node based on the voltage control signal, and configured to provide a raised voltage to the first output node, and
   wherein the first buffer control signal is outputted from the first output node.

3. The pulse width compensation circuit according to claim 2,
   wherein the second compensation circuit comprises:
   a second pull-up driver configured to pull-up drive a pull-up node to a voltage level of the first power supply voltage based on the compensation signal;
   a high voltage level lowering circuit configured to lower a voltage level of the pull-up node based on the voltage control signal, and configured to provide a lowered voltage to a second output node; and
a second pull-down driver configured to pull-down drive the second output node to the second power supply voltage based on the compensation signal, and
wherein the second buffer control signal is outputted from the second output node.

4. The pulse width compensation circuit according to claim 1,
wherein the first compensation circuit comprises:
a first pull-up driver configured to pull-up drive a pull-up node to a voltage level of the first power supply voltage based on the input signal;
a high voltage level lowering circuit configured to lower a voltage level of the pull-up node based on the voltage control signal, and configured to provide a lowered voltage to a first output node; and
a first pull-down driver configured to pull-down drive the first output node to a second power supply voltage based on the input signal, and
wherein the first buffer control signal is outputted from the first output node.

5. The pulse width compensation circuit according to claim 4,
wherein the second compensation circuit comprises:
a second pull-up driver configured to pull-up drive a second output node to a voltage level of the first power supply voltage based on the compensation signal;
a second pull-down driver configured to pull-down drive a pull-down node to a voltage level of the second power supply voltage based on the compensation signal; and
a low voltage level raising circuit configured to raise a voltage level of the pull-down node based on the voltage control signal, and provide a raised voltage to the second output node, and
wherein the second buffer control signal is outputted from the second output node.

6. A semiconductor apparatus comprising:
a voltage control circuit configured to generate at least one voltage control signal by sensing a voltage level of a first power supply voltage;
a pulse width adjustment circuit configured to generate an output signal by changing the pulse width of an input signal based on the at least one voltage control signal, wherein the pulse width adjustment circuit comprises:
a first compensation circuit configured to generate a first buffer control signal based on the input signal, and configured to change anyone of a low voltage level and a high voltage level of the first buffer control signal based on the at least one voltage control signal;
a first buffer configured to generate a compensation signal based on the first buffer control signal;
a second compensation circuit configured to generate a second buffer control signal based on the compensation signal, and configured to change a voltage level which is complementary to a voltage level changed by the first compensation circuit, among a low voltage level and a high voltage level of the second buffer control signal, based on the at least one voltage control signal; and
a second buffer configured to generate the output signal based on the second buffer control signal; and
an internal circuit configured to supply an operation voltage based on the output signal.

7. The semiconductor apparatus according to claim 6, wherein the pulse width adjustment circuit generates the output signal which has a wide pulse width when the voltage level of the first power supply voltage is lower than a target voltage level, and generates the output signal which has a narrow pulse width when the voltage level of the first power supply voltage is higher than the target voltage level.

8. The semiconductor apparatus according to claim 6,
wherein the pulse width adjustment circuit generates the output signal by changing an enable period of the input signal based on the at least one voltage control signal.

9. The semiconductor apparatus according to claim 6,
wherein the first compensation circuit comprises:
a first pull-up driver configured to pull-up drive a first output node to a voltage level of the first power supply voltage based on the input signal;
a first pull-down driver configured to pull-down drive a pull-down node to a voltage level of a second power supply voltage based on the input signal; and
a low voltage level raising circuit configured to raise a voltage level of the pull-down node based on the at least one voltage control signal, and provide a raised voltage to the first output node, and
wherein the first buffer control signal is outputted from the first output node.

10. The semiconductor apparatus according to claim 9,
wherein the low voltage level raising circuit comprises:
a plurality of transistors coupled in series between the first output node and the pull-down node, wherein each transistor of the plurality of transistors is configured to be turned on based on an assigned voltage control signal of the at least one voltage control signal; and
a plurality of resistors coupled in parallel with the plurality of transistors between the first output node and the pull-down node.

11. The semiconductor apparatus according to claim 9,
wherein the low voltage level raising circuit comprises:
a first plurality of transistors coupled between the first output node and the pull-down node, wherein each transistor of the first plurality of transistors is configured to be turned on based on an assigned voltage control signal of the at least one voltage control signal; and
a second plurality of transistors coupled in parallel with the first plurality of transistors between the first output node and the pull-down node, wherein each transistor of the second plurality of transistors is configured to be turned on based on a complementary signal of an assigned voltage control signal of the at least one voltage control signal.

12. The semiconductor apparatus according to claim 9,
wherein the second compensation circuit comprises:
a second pull-up driver configured to pull-up drive a pull-up node to a voltage level of the first power supply voltage based on the compensation signal;
a high voltage level lowering circuit configured to lower a voltage level of the pull-up node based on the at least one voltage control signal, and configured to provide a lowered voltage to a second output node; and
a second pull-down driver configured to pull-down drive the second output node to the second power supply voltage based on the compensation signal, and
wherein the second buffer control signal is outputted from the second output node.

13. The semiconductor apparatus according to claim 12,
wherein the high voltage level lowering circuit comprises:
a plurality of transistors coupled in series between the pull-up node and the second output node, wherein each transistor of the plurality of transistors is configured to be turned on based on an assigned voltage control signal of the at least one voltage control signal; and a plurality of resistors coupled in parallel with the plurality of transistors between the pull-up node and the second output node.

14. The semiconductor apparatus according to claim 12, wherein the high voltage level lowering circuit comprises:

a first plurality of transistors coupled between the pull-up node and the second output node, wherein each transistor of the first plurality of transistors is configured to be turned on based on a complementary signal of an assigned voltage control signal of the at least one voltage control signal; and a second plurality of transistors coupled in parallel with the first plurality of transistors between the pull-up node and the second output node, wherein each transistor of the second plurality of transistors is configured to be turned on based on an assigned voltage control signal of the at least one voltage control signal.

15. A pulse width compensation circuit comprising:

a voltage control circuit configured to generate a voltage control signal by sensing a voltage level of a first power supply voltage;

a first compensation circuit configured to receive an input signal to generate a first buffer control signal, and configured to change an enable period of the first buffer control signal based on the voltage control signal;

a first buffer configured to generate a compensation signal based on the first buffer control signal;

a second compensation circuit configured to receive the compensation signal to generate a second buffer control signal, and configured to change an enable period of the second buffer control signal based on the voltage control signal; and a second buffer configured to generate an output signal based on the second buffer control signal.

* * * * *